United States Patent
Hartwell

(10) Patent No.: US 6,750,516 B2
(45) Date of Patent: Jun. 15, 2004

(54) SYSTEMS AND METHODS FOR ELECTRICALLY ISOLATING PORTIONS OF WAFERS

(75) Inventor: Peter George Hartwell, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/035,792

(22) Filed: Oct. 18, 2001

(65) Prior Publication Data

US 2003/0077877 A1 Apr. 24, 2003

(51) Int. Cl.[7] .......................... H01L 29/76; H01L 29/00
(52) U.S. Cl. .................. 257/397; 257/506; 257/508; 257/510; 257/521
(58) Field of Search .................. 257/383, 510, 257/503, 386, 508, 397, 659, 521

(56) References Cited

U.S. PATENT DOCUMENTS

| | | | | |
|---|---|---|---|---|
| 4,688,069 A | * | 8/1987 | Joy et al. ................... | 257/397 |
| 4,733,287 A | * | 3/1988 | Bower ........................ | 257/508 |
| 4,939,567 A | * | 7/1990 | Kenney ...................... | 257/383 |
| 4,949,151 A | * | 8/1990 | Horiuchi et al. ............ | 257/508 |
| 5,644,157 A | * | 7/1997 | Iida et al. ................... | 257/510 |
| 5,760,452 A | * | 6/1998 | Terada ........................ | 257/386 |
| 6,051,868 A | * | 4/2000 | Watanabe et al. ........... | 257/503 |
| 6,472,723 B1 | * | 10/2002 | Jarstad et al. ............... | 257/659 |
| 6,515,334 B2 | * | 2/2003 | Yamazaki et al. .......... | 257/347 |

* cited by examiner

Primary Examiner—John F. Niebling
Assistant Examiner—Ron Pompey

(57) ABSTRACT

Systems for electrically isolating portions of wafers are provided. A representative system includes a first wafer and a first conductor formed at least partially through the first wafer. A first conductor insulating layer is formed at least partially through the first wafer. The first conductor insulating layer engages the first conductor and is disposed between the first conductor and material of the first wafer. A first outer insulating layer also is provided that is formed at least partially through the first wafer. The first outer insulating layer is spaced from the first conductor insulating layer. Both the first conductor insulating layer and the first outer insulating layer are formed of dielectric material. Methods also are provided.

24 Claims, 6 Drawing Sheets ated to electrically isolating portions of wafers. More specifically, the invention relates to systems and methods pertaining to semiconductors that incorporate one or more electrically isolated portions.

SYSTEMS AND METHODS FOR ELECTRICALLY ISOLATING PORTIONS OF WAFERS

BACKGROUND OF THE INVENTION

1. Field of the Invention

The present invention generally relates to semiconductors. More specifically, the invention relates to systems and methods pertaining to semiconductors that incorporate one or more electrically isolated portions.

2. Description of the Related Art

Semiconductor wafers oftentimes are arranged in an overlying relationship with each other and are bonded together to form a wafer stack. In order to facilitate communication of processing of one wafer of such a wafer stack with processing of another wafer, various interconnecting structures may be used. For example, wires can be used to interconnect components of the various wafers so that the components can electrically communicate with each other. In other wafer stacks, conductor vias can be used. A representative example of such a via is depicted in FIG. 1.

As shown in FIG. 1, wafer 100 includes a via structure 102 that is formed through the material of the wafer. Via structure 102 includes an insulator ring 104 that is formed about a conductor 106. Via structure 102 permits the propagation of low voltage signals from one side of wafer 100 to the other side. More specifically, such a signal can be propagated from one side of the wafer to the other through conductor 106. Unfortunately, via structure 102 tends to breakdown or short when relatively large potential differences exist between the conductor 106 and the substrate 108. Thus, it can be appreciated that there is a need for improved systems and methods that address these and/or other shortcomings of the prior art.

SUMMARY OF THE INVENTION

Briefly described, the present invention relates to semiconductors that incorporate one or more electrically isolated portions. In this regard, embodiments of the invention may be construed as providing methods for electrically isolating portions of wafers. A representative method includes the steps of: providing a first wafer; forming a first conductor at least partially through the first wafer; disposing first dielectric material between the first conductor and material of the first wafer; and at least partially surrounding the first conductor and the first dielectric material with second dielectric material. Preferably, the second dielectric material is spaced from the first dielectric material so that a first portion of the material of the first wafer is arranged between the first dielectric material and the second dielectric material and a second portion of the material of the first wafer is arranged outside an outer periphery of the second dielectric material.

Embodiments of the invention also may be construed as providing systems for electrically isolating portions of wafers. In this regard, a representative embodiment includes a first wafer and a first conductor formed at least partially through the first wafer. A first conductor insulating layer is formed at least partially through the first wafer. The first conductor insulating layer engages the first conductor and is disposed between the first conductor and material of the first wafer. A first outer insulating layer also is provided that is formed at least partially through the first wafer. The first outer insulating layer is spaced from the first conductor insulating layer. Both the first conductor insulating layer and the first outer insulating layer are formed of dielectric material.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION

As described in greater detail hereinafter, the present invention relates to electrically isolating portions of a wafer. More specifically, embodiments of the invention involve the use of via structures that are electrically isolated from the substrate that surrounds the via structures. In this manner, the via structures can be adapted to facilitate communication of signals, e.g., power signal and/or data signals, through at least a portion of a wafer while reducing the potential of electrical breakdown of the substrate in the vicinity of the via structures.

Figure 1:
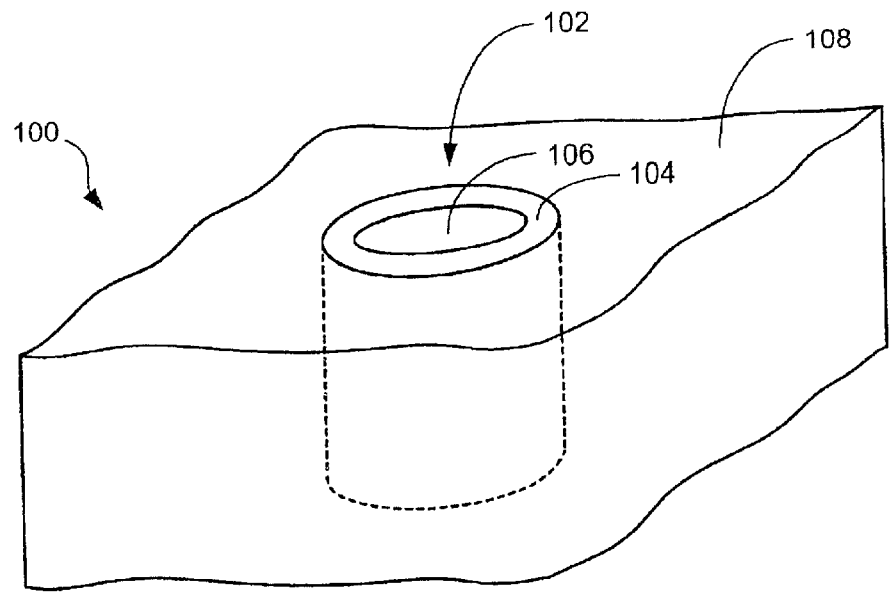
FIG. 1 is a schematic diagram depicting a prior art via structure.
Figure 2:
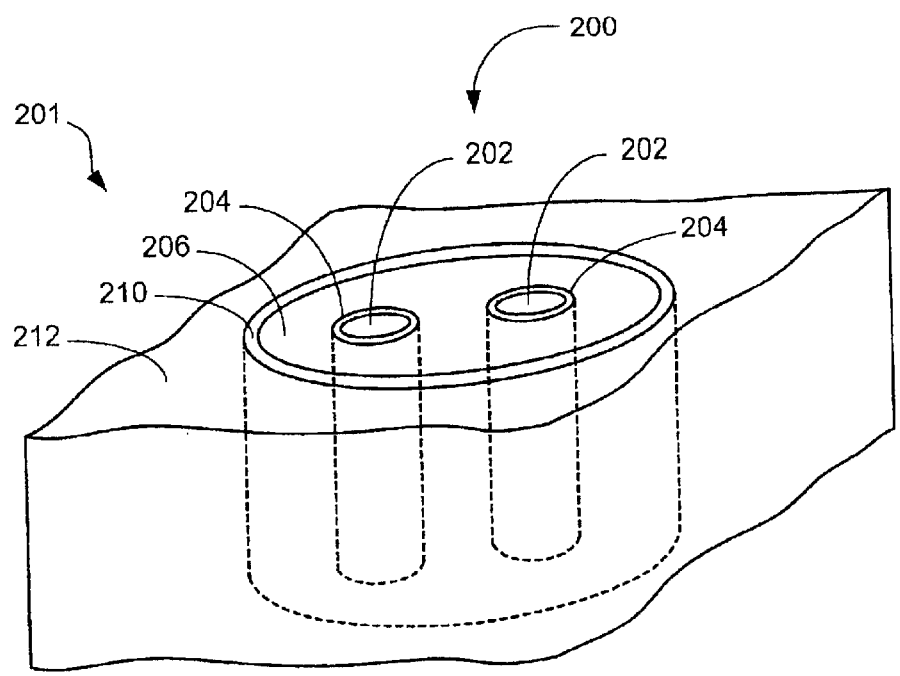
FIG. 2 is a schematic diagram depicting an embodiment of the via structure of the present invention.

Referring now to the drawings, wherein like reference numerals indicate corresponding parts through the several views, FIG. 2 schematically depicts an embodiment of a via structure 200 of the invention. In FIG. 2, via structure 200 is provided in wafer 201 and includes one or more conductors 202. More specifically, the embodiment of FIG. 2 depicts two such conductors. As described hereinafter, the conductors preferably are formed of substrate material, such as doped silicon.

An insulating layer 204 is provided about each conductor. The insulating layers can be formed of various materials, such as silicon dioxide, silicon nitride, polycrystalline silicon, or combinations thereof. Each insulating layer 204 forms a physical barrier between a conductor and substrate material 206 that surrounds the conductor.

Via structure 200 also includes an outer insulating layer 210 that is formed about the conductor(s). Outer insulating layer 210 can be formed of various materials, such as silicon dioxide, silicon nitride, polycrystalline silicon, or combinations thereof. The outer insulating layer 210 is adapted to electrically isolate the conductor(s) and/or substrate material 206, which is surrounded by the outer insulating layer, from substrate material 212 and/or components (not shown) arranged outside the outer insulating layer. So configured, each of the conductors can be adequately electrically isolated from an adjacent conductor as well as from material 212 and/or components arranged outside the outer insulating layer. In some embodiments, the conductors can be used to propagate signals between various wafers of a wafer assembly, such as a wafer stack. In other embodiments, conductors of the via structures can be used to propagate signals between components arranged at various depths of a single wafer.

Via structures of the invention, e.g., via structures 200, can be formed by creating trenches in a substrate. For instance, trenches can be formed by an etching process. After formation, the trenches are filled with insulating material, such as through deposition or growth, to define the insulating layers and outer insulating layers of the via structures. Since the trenches typically do not extend entirely through the substrate material, the via structures formed by the aforementioned process typically do not extend entirely through the substrate. In those applications where it is desirable for one or more of the via structures to extend entirely through the substrate, a portion of the substrate can be removed, such as by grinding or etching away a portion of the substrate material, to expose the previously buried end of the via structure.

Figure 3:
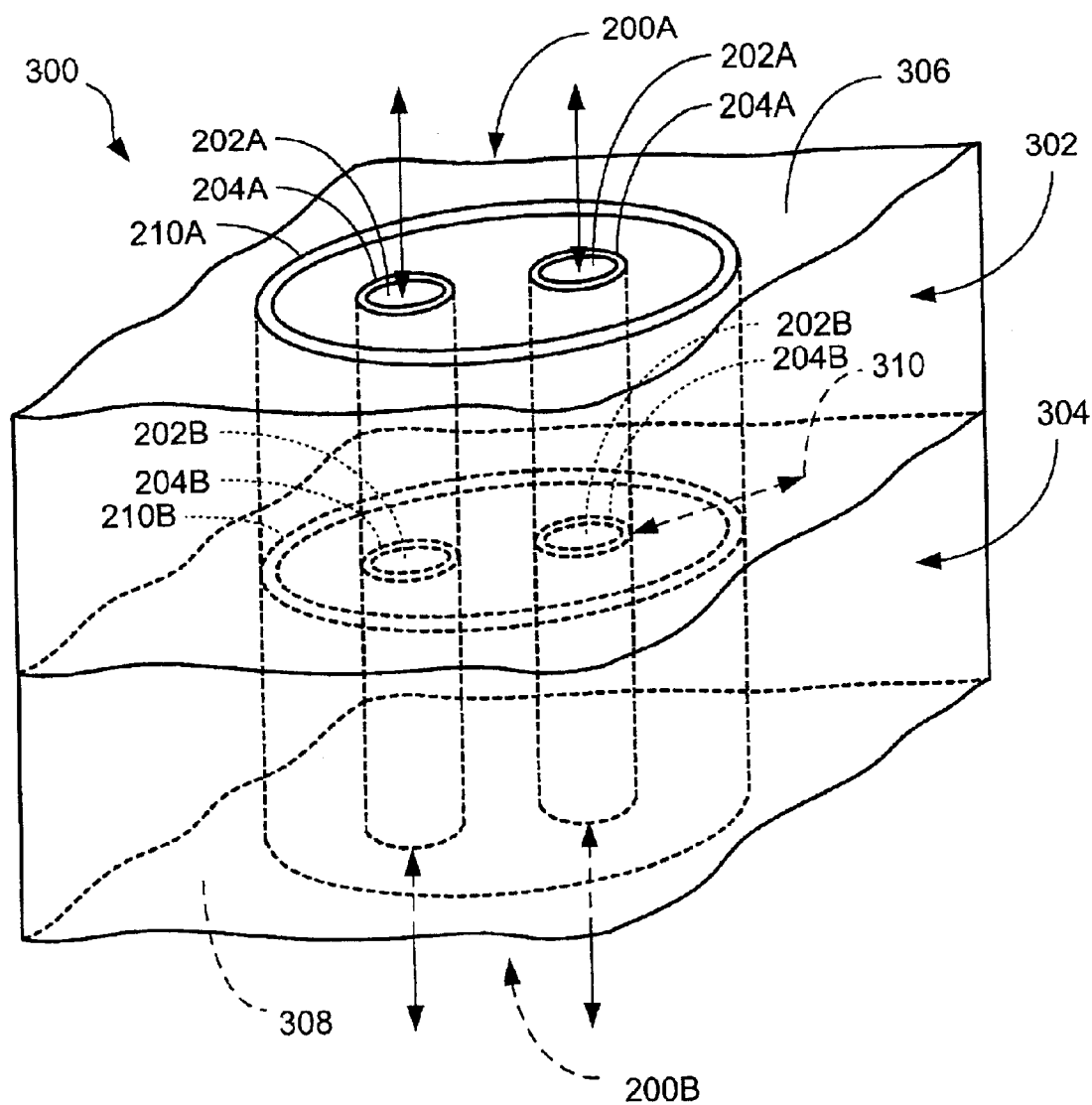
FIG. 3 is a schematic diagram depicting representative via structures shown formed as a portion of a wafer stack.

As mentioned hereinbefore, via structures 200 can be used to facilitate electrical communication between various locations of a wafer and/or wafer stack. For example, in FIG. 3, two via structures 200A, 200B are depicted in a wafer stack 300. In particular, via structure 200A is formed through wafer 302 and via structure 200B is formed through wafer 304. Via structure 200A includes two conductors 202A and their associated insulating layers 204A as well as an outer insulating layer 210A. Likewise, via structure 200B includes two conductors 202B and their associated insulating layers 204B as well as an outer insulating layer 210B. Each conductor 202A electrically communicates with a corresponding conductor 202B. So arranged, electrical signals can be propagated via the conductors to and/or from various locations of wafer stack 300. For example, electrical signals (represented by arrows) can be propagated between outer surfaces 306 and 308, and/or between an outer surface of the wafer stack and a location, e.g., location 310, defined between the wafers.

It should be noted that wafer stacks depicted herein, e.g. wafer stack 300 (FIG. 3) although including only two wafers, could be provided in various configurations and could incorporate various numbers of wafers other than those shown. All such configurations and numbers of wafers are considered well within the scope of the present invention.

Figure 4:
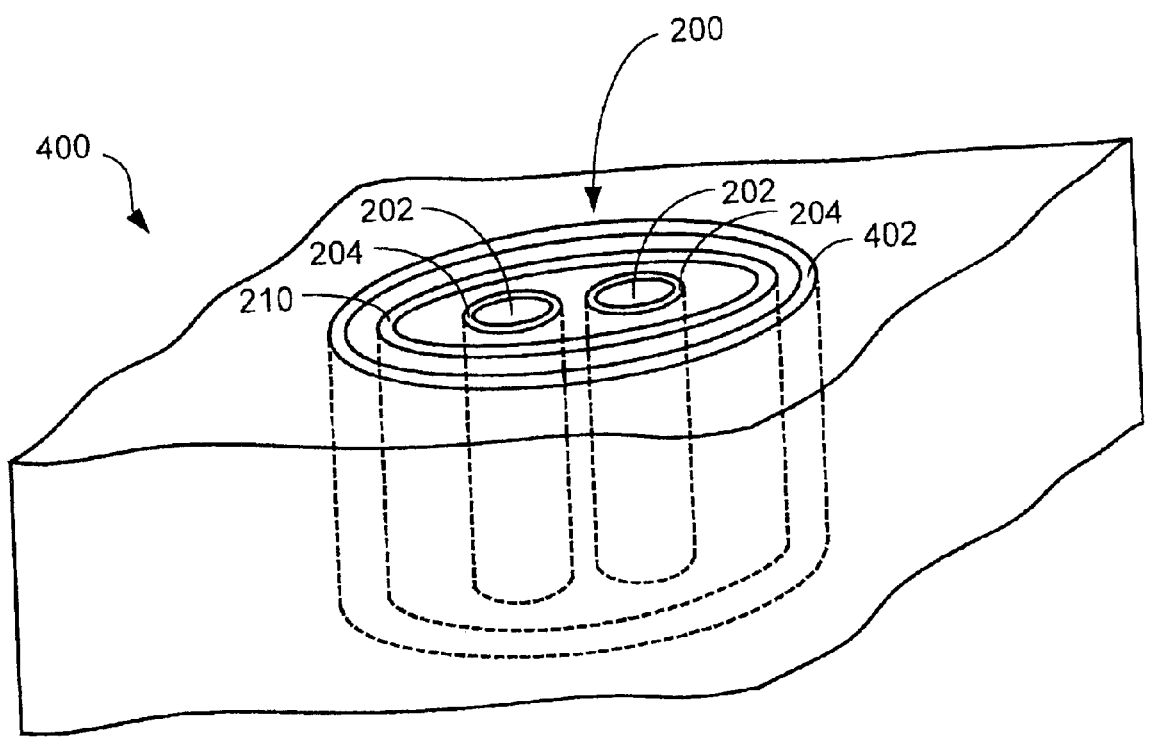
FIG. 4 is a schematic diagram depicting an embodiment of the via structure of the present invention.

As depicted in FIG. 4, embodiments of the via structure 200 can include multiple outer insulating layers. More specifically, the embodiment of FIG. 4, which is formed in a wafer 400, includes a first outer insulating layer 210 and a second outer insulating layer 402. This particular configuration offers the advantage of enabling the application of a higher electrical potential between the conductor(s) and the material of the substrate arranged outside the second outer insulating layer without resulting in breakdown.

Figure 5:
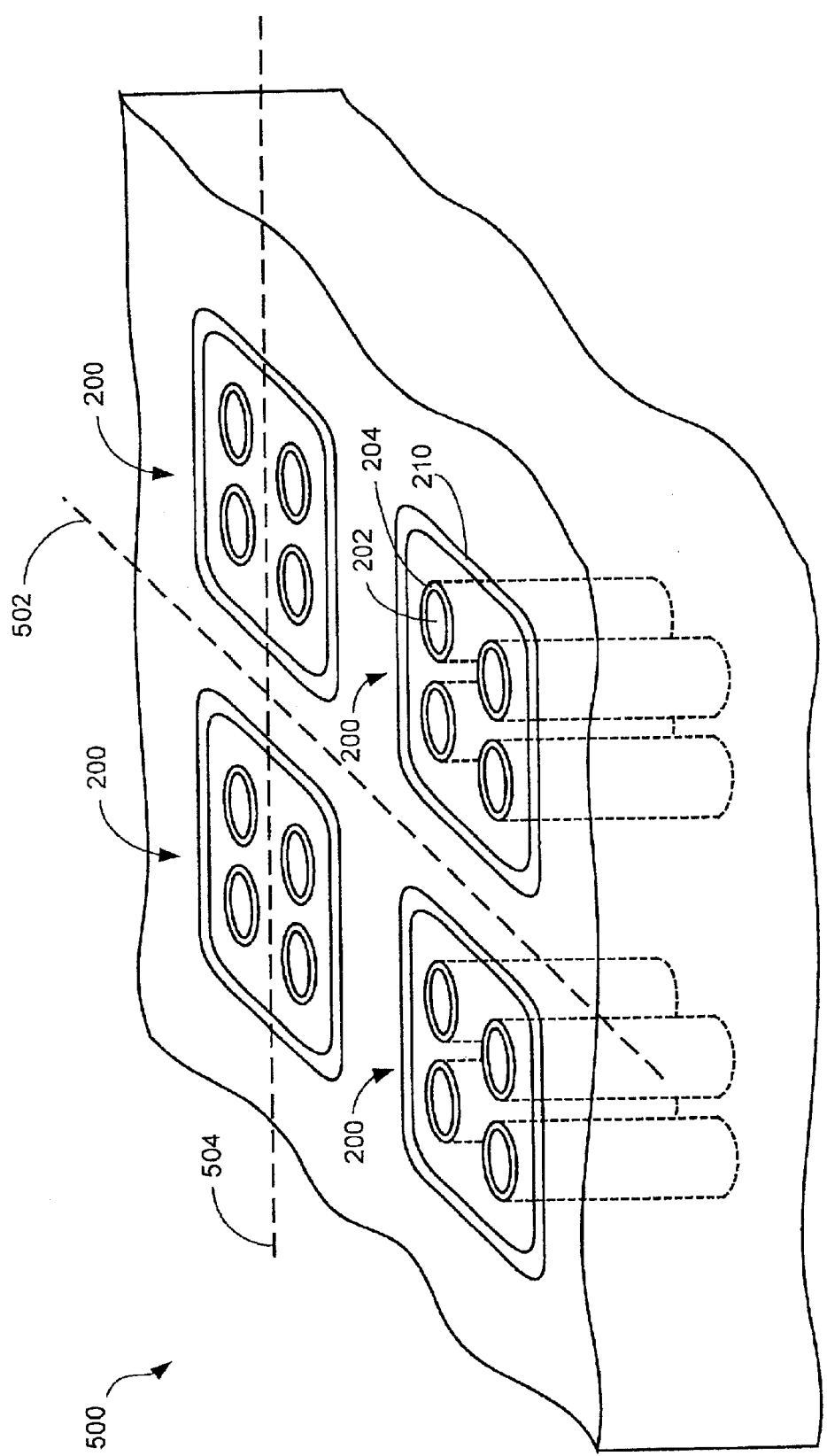
FIG. 5 is a schematic diagram depicting a portion of a wafer that includes multiple via structures.

Reference will now be made to the schematic diagram of FIG. 5 which depicts an array of via structures formed in a wafer 500. As shown in FIG. 5, each via structure 200 includes at least one conductor 202. In particular, each via structure of FIG. 5 includes four conductors 202. It should be noted, however, that various other numbers and arrangements of conductors can be used. As described in detail hereinbefore, an insulating layer 204 is formed about each conductor 202. Additionally, the conductors and associated insulating layers of each high voltage via structure 200 are surrounded by an outer insulating layer 210.

FIG. 5 also depicts dicing locations 502 and 504 where wafer 500 is to be diced. For example, wafer 500 can be diced by through-cutting or etching the material of the wafer. In FIG. 5, dicing location 502 is arranged between adjacent via structures 200, whereas dicing location 504 is arranged to divide a row of the via structures by separating each high voltage via structure into multiple via assemblies, which are described in detail hereinafter.

Figure 6:
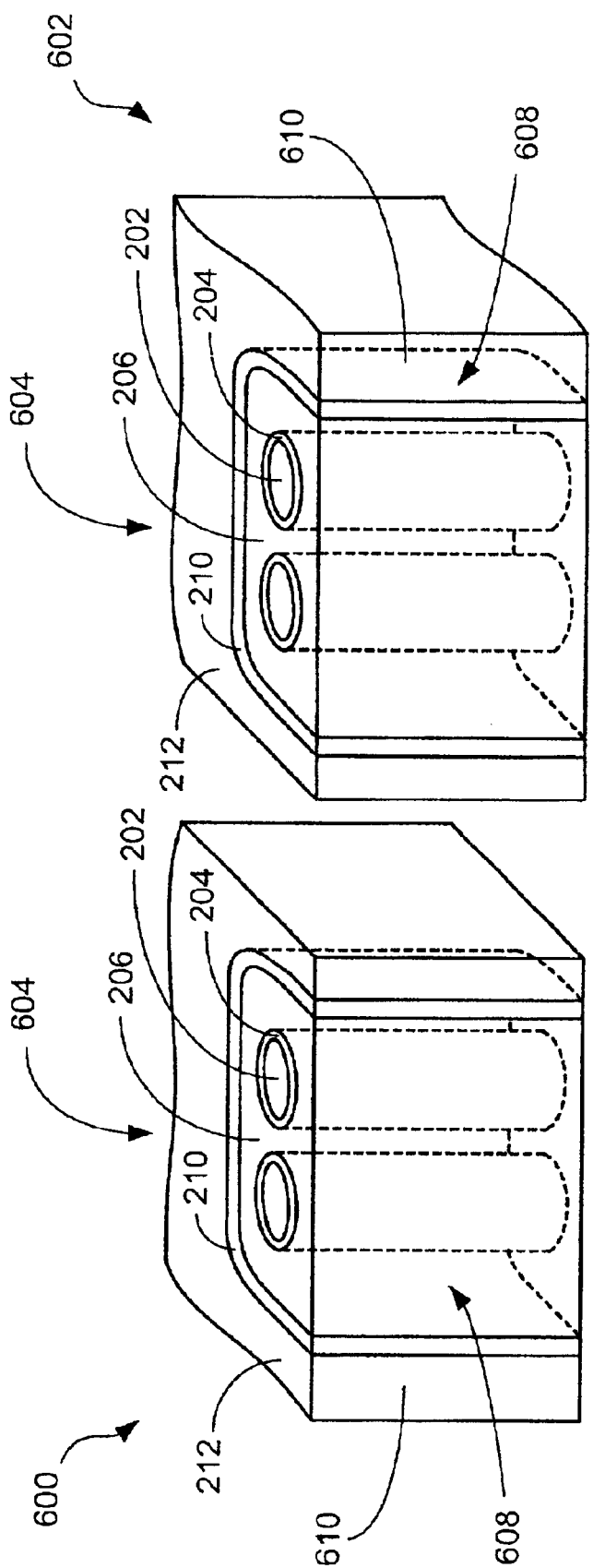
FIG. 6 is a schematic diagram depicting representative portions of the wafer of FIG. 5 shown after a dicing procedure.

As shown in FIG. 6, various die assemblies can be formed by dicing wafer 500 (FIG. 5) along the dicing locations. Representative portions of two such die assemblies, i.e., die assemblies 600 and 602, are depicted in FIG. 6. In FIG. 6, each of the die assemblies includes a via assembly 604. Each via assembly 604 includes at least one conductor 202 and its associated insulating layer 204, a portion of an outer insulating layer 210, and material 206 of the wafer that is electrically isolated from other material 212 of the wafer. Since each via assembly abuts an outer edge, e.g., sidewall 610, of its wafer, electrical isolation of signals propagated through a conductor(s) of the high voltage via assembly is at least partially facilitated by an air gap 608. Thus, in FIG. 7, each conductor 202 is electrically isolated from material 212 of the substrate by at least one insulating layer 204, material 206 which at least partially surrounds the conductor, at least a portion of at least one outer insulating layer 210, and an air gap 608.

Figure 7:
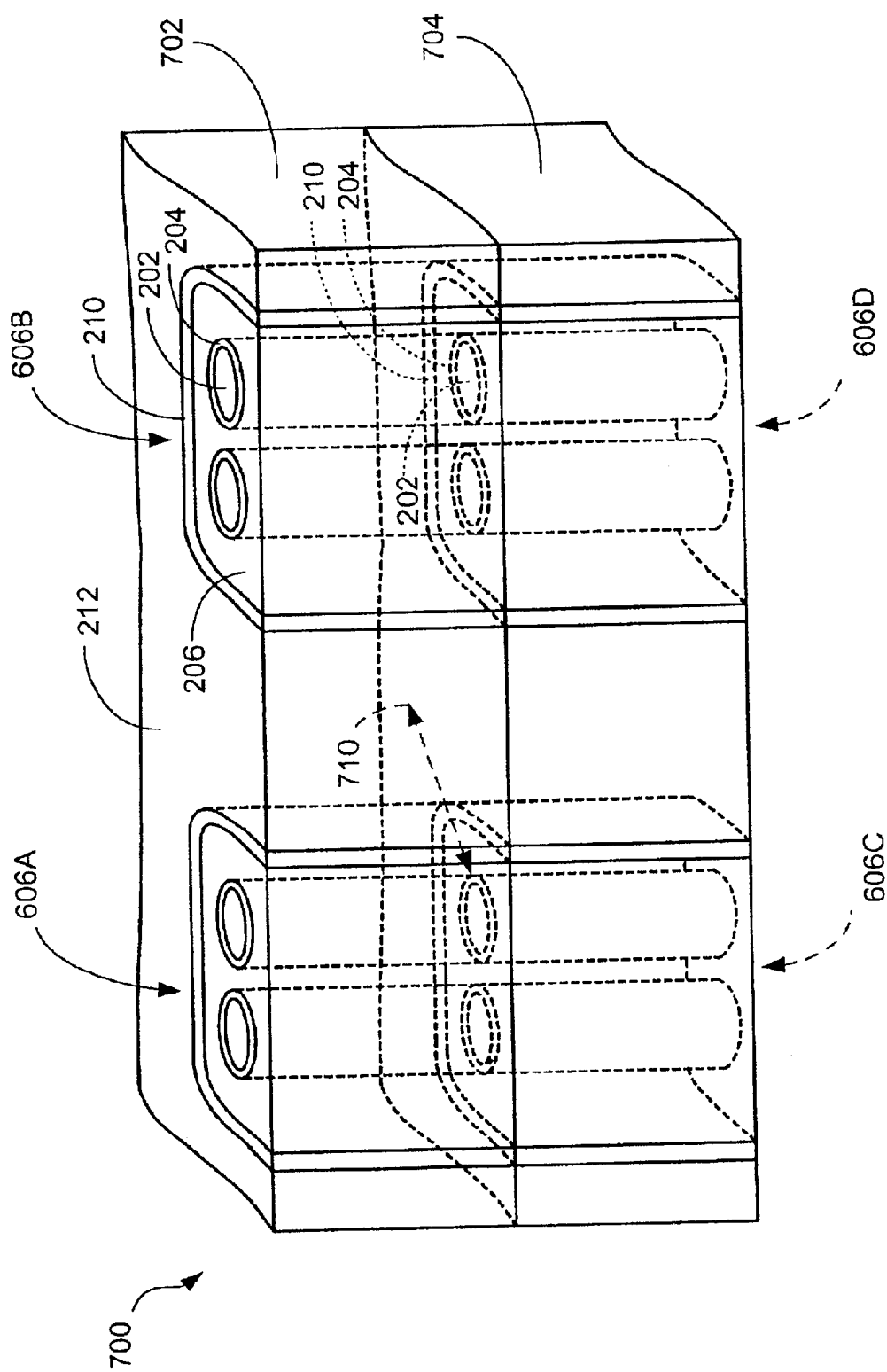
FIG. 7 is a schematic diagram depicting representative portions of the wafer of FIGS. 5 and 6 shown formed as a portion of a wafer stack.

In FIG. 7, it is shown that via assemblies 606 can be used to facilitate communication of components arranged at various locations of a wafer stack. More specifically, two via assemblies 606A, 606B of a wafer 702 and two via assemblies 606C, 606D of a wafer 704 are depicted in a wafer stack 700. Each of the via assemblies includes two conductors and their associated insulating layers as well as a portion of an outer insulating layer. Each conductor electrically communicates with a corresponding conductor of the other wafer. So arranged, electrical signals can be propagated via the conductors to and/or from various locations of wafer stack 700. For example, electrical signals (represented by arrows) can be propagated between outer surfaces 706 and 708, and/or between an outer surface of the wafer stack and a location, e.g., location 710, defined between the wafers.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A system for electrically isolating a portion of a wafer comprising:

a first wafer having a first side and an opposing second side;

a first conductor extending through said first wafer from said first side to said second side;

a first conductor insulating layer extending through said first wafer, said first conductor insulating layer engaging said first conductor and disposed between said first conductor and material of said first wafer, said first conductor insulating layer being formed of dielectric material; and a first outer insulating layer extending through said first wafer from said first side to said second side and spaced from said first conductor insulating layer such that said first outer insulating layer at least partially electrically isolates said first conductor from portions of the first wafer located outside said first outer insulating layer, said first outer insulating layer being formed of dielectric material.

2. The system of claim 1, further comprising:

a second outer insulating layer through said first wafer from said first side to said second side and spaced from said first outer insulating layer such that said first outer insulating layer is arranged between said second outer insulating layer and said first conductor insulating layer, said second outer insulating layer being formed of dielectric material.

3. The system of claim 1, further comprising:

a second conductor formed at least partially through said first wafer, said second conductor being arranged within an area at least partially bounded by said first outer insulating layer; and a second conductor insulating layer formed at least partially through said first wafer, said second conductor insulating layer engaging said second conductor and disposed between said second conductor and material of said first wafer, said second conductor insulating layer being formed of dielectric material.

4. The system of claim 1, farther comprising:

a second wafer at least partially overlying said first wafer;

a first conductor formed at least partially through said second wafer;

a first conductor insulating layer formed at least partially through said second wafer, said first conductor insulating layer of said second wafer engaging said first conductor of said second wafer and disposed between said first conductor of said second wafer and material of said second wafer, said first conductor insulating layer of said second wafer being formed of dielectric material; and a first outer insulating layer formed at least partially through said second wafer and spaced from said first conductor insulating layer of said second wafer, said first outer insulating layer of said second wafer being formed of dielectric material;

said first conductor of said second wafer electrically communicating with said first conductor of said first wafer.

5. The system of claim 1, further comprising:

a second outer insulating layer formed at least partially through said first wafer and spaced from said first outer insulating layer such that said first outer insulating layer is arranged between said second outer insulating layer and said first conductor insulating layer, said second outer insulating layer being formed of dielectric material.

6. The system of claim 5, further comprising:

a second conductor extending through said first wafer from said first side to said second side, said second conductor being arranged within an area at least partially bounded by said first outer insulating layer; and a second conductor insulating layer formed at least partially through said first wafer, said second conductor insulating layer engaging said second conductor and disposed between said second conductor and material of said first wafer, said second conductor insulating layer being formed of dielectric material.

7. The system of claim 1, wherein said first wafer has a sidewall extending between said first side and said second side, and wherein said first outer insulating layer intersects said sidewall.

8. The system of claim 1, further comprising:

a second wafer at least partially overlying said first wafer;

a first conductor extending through said second wafer;

a first conductor insulating layer formed at least partially through said second wafer, said first conductor insulating layer of said second wafer engaging said first conductor of said second wafer and disposed between said first conductor of said second wafer and material of said second wafer, said first conductor insulating layer of said second wafer being formed of dielectric material; and a first outer insulating layer extending through said second wafer and spaced from said first conductor insulating layer of said second wafer, said first outer insulating layer of said second wafer being formed of dielectric material;

said first conductor of said second wafer electrically communicating with said first conductor of said first wafer.

9. The system of claim 8, wherein said second wafer has a first side, a second side opposing said first side, and a sidewall extending between said first side and said second side, wherein said first conductor of said second wafer extends through said second wafer from said first side to said second side.

10. The system of claim 9, wherein said first outer insulating layer of said second wafer intersects, said sidewall of said second wafer.

11. A system comprising:

a first semiconductor wafer having a substrate material; and a via structure adapted to provide electrical communication through the first wafer, the via structure comprising:

first and second conductors having insulating layers to form a barrier with the substrate; and an outer insulating layer formed about both the first and second conductors to electrically isolate the first and second conductors from the substrate material.

12. The system of claim 11 further comprising a second semiconductor wafer stacked to the first wafer, wherein the via structure provides electrical communication between the first wafer and the second wafer.

13. The system of claim 11 further comprising a second semiconductor wafer in overlying relationship with the first wafer, wherein the second wafer comprises:

a via structure adapted to provide electrical communication through the second wafer, the via structure comprising:

first and second conductors having insulating layers to form a barrier with the substrate; and a first outer insulating layer formed about both the first and second conductors to electrically isolate the first and second conductors from the substrate material.

14. The system of claim 13 wherein the via structure of the first wafer propagates signals to the via structure of the second wafer.

15. The system of claim 14 wherein the signals are selected from the group consisting of power signals and data signals.

16. The system of claim 11 wherein the first and second conductors are electrically isolated from each other and from substrate material outside of the first outer insulating layer.

17. The system of claim 11 wherein the via structure is adapted to provide electrical communication to various locations within the first wafer itself.

18. The system of claim 17 wherein the electrical communication comprises a data signal.

19. The system of claim 17 wherein the electrical communication comprises a power signal.

20. The system of claim 11 further comprising a second outer insulating layer formed about the first outer insulating layer and about both the first and second conductors.

21. A system, comprising:
   a plurality of semiconductor wafers forming a wafer stack, each wafer comprising:
   a substrate material; and
   a via structure in the substrate material, the via structure providing electrical communication from one wafer to another wafer, each via structure comprising a first conductor having an insulating layer, a second conductor having an insulating layer and being electrically insulated from the first conductor, and an outer insulating layer formed around both the first and second conductors to electrically isolate the first and second conductors from the substrate material.

22. The system of claim 21 wherein electrical signals propagate from the via structure of one wafer to the via structure of another wafer.

23. The system of claim 21 wherein electrical signals propagate through one of the via structures from an outer surface of one wafer to a location defined between two wafers.

24. The system of claim 21 wherein electrical signals propagate through the wafer stack through the via structure.

* * * * *